US009390885B2

(12) United States Patent
Yamamoto et al.

(10) Patent No.: US 9,390,885 B2
(45) Date of Patent: Jul. 12, 2016

(54) SUPERPOSITION MEASURING APPARATUS, SUPERPOSITION MEASURING METHOD, AND SUPERPOSITION MEASURING SYSTEM

(71) Applicant: Hitachi High-Technologies Corporation, Minato-ku, Tokyo (JP)

(72) Inventors: Takuma Yamamoto, Tokyo (JP); Yasunori Goto, Tokyo (JP); Fumihiko Fukunaga, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/888,792

(22) PCT Filed: Mar. 10, 2014

(86) PCT No.: PCT/JP2014/056093
§ 371 (c)(1),
(2) Date: Nov. 3, 2015

(87) PCT Pub. No.: WO2014/181577
PCT Pub. Date: Nov. 13, 2014

(65) Prior Publication Data
US 2016/0056014 A1 Feb. 25, 2016

(30) Foreign Application Priority Data
May 9, 2013 (JP) .................................. 2013-098960

(51) Int. Cl.
*H01J 37/22* (2006.01)
*G03F 7/20* (2006.01)
*G01B 15/00* (2006.01)
*H01J 37/28* (2006.01)

(52) U.S. Cl.
CPC .............. *H01J 37/222* (2013.01); *G01B 15/00* (2013.01); *G03F 7/70633* (2013.01);
(Continued)

(58) Field of Classification Search
USPC .................................................. 250/306, 307
See application file for complete search history.

(56) References Cited

U.S. PATENT DOCUMENTS 7,679,055 B2    3/2010   Sutani et al.
(Continued)

FOREIGN PATENT DOCUMENTS

JP    2004-127784 A    4/2004
JP    2006-214816 A    8/2006
(Continued)

OTHER PUBLICATIONS

International Search Report (PCT/ISA/210) issued in PCT Application No. PCT/JP2014/056093 dated Jun. 17, 2014 with English translation (five pages).

*Primary Examiner* — Kiet T Nguyen
(74) *Attorney, Agent, or Firm* — Crowell & Moring LLP

(57) ABSTRACT

When a scanning electron microscope is used to measure a superposition error between upper-layer and lower-layer patterns, an SN of the lower-layer pattern may often be lower, so that when simple frame adding processing is used, the adding processing needs to be performed many times. Further, in an image obtained through such simple adding processing, contrast may not be optimal for both the upper-layer and lower-layer patterns. In a superposition measuring apparatus and superposition measuring method that measure a difference between a position of an upper-layer pattern and a position of a lower-layer pattern by using an image obtained by irradiation of a charged particle ray, portions of images having contrasts optimized for the respective upper-layer and lower-layer patterns are added to generate a first added image optimized for the upper-layer pattern and a second added image optimized for the lower-layer pattern, and the difference between the position of the upper-layer pattern identified by using the first added image and position of the lower-layer pattern identified by using the second added image is calculated.

12 Claims, 18 Drawing Sheets

(52) U.S. Cl.
CPC .......... *H01J 37/28* (2013.01); *H01J 2237/221* (2013.01); *H01J 2237/2806* (2013.01); *H01J 2237/2817* (2013.01)

(56) References Cited

U.S. PATENT DOCUMENTS

| | | | |
|---|---|---|---|
| 7,838,858 | B2 | 11/2010 | Okita |
| 8,148,682 | B2 | 4/2012 | Hotta et al. |
| 8,653,456 | B2 | 2/2014 | Toyoda et al. |
| 8,953,855 | B2 | 2/2015 | Namai et al. |
| 2013/0170757 | A1* | 7/2013 | Shinoda ................ G06K 9/00 382/209 |

FOREIGN PATENT DOCUMENTS

| | | |
|---|---|---|
| JP | 2008-58166 A | 3/2008 |
| JP | 2009-211960 A | 9/2009 |
| JP | 2011-142321 A | 7/2011 |
| JP | 2011-165479 A | 8/2011 |
| WO | WO 2006/129711 A1 | 12/2006 |

* cited by examiner

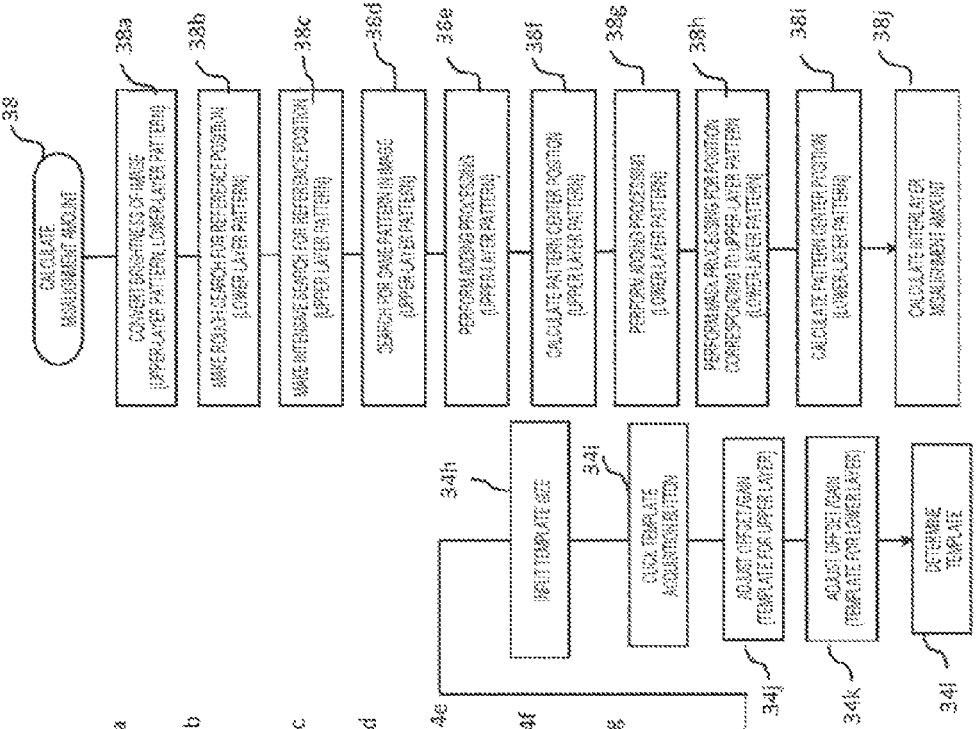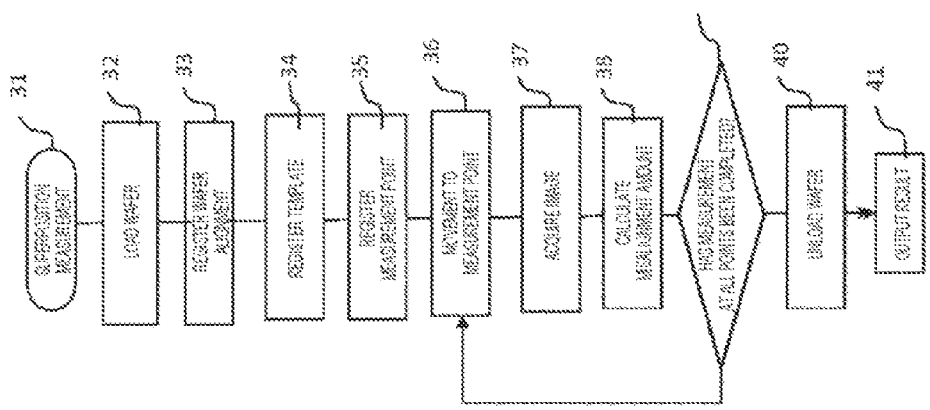

FIG. 14

| MEASUREMENT POINT | SHOT X | SHOT Y | SHOT COORDINATE X (m) | SHOT COORDINATE Y (m) | MISALIGNMENT X (nm) | MISALIGNMENT Y (nm) |
|---|---|---|---|---|---|---|
| 1 | 0 | -1 | 600 | 300 | 2.2 | 2.2 |
| 2 | 0 | -1 | 600 | 30,000 | 2.3 | 3.8 |
| 3 | 0 | -1 | 25,000 | 300 | 1.2 | 2.3 |
| 4 | 0 | -1 | 25,000 | 30,000 | 1.5 | 2.9 |
| 5 | 0 | 1 | 600 | 300 | 2.1 | 2.0 |

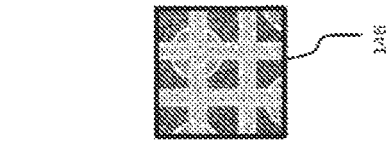
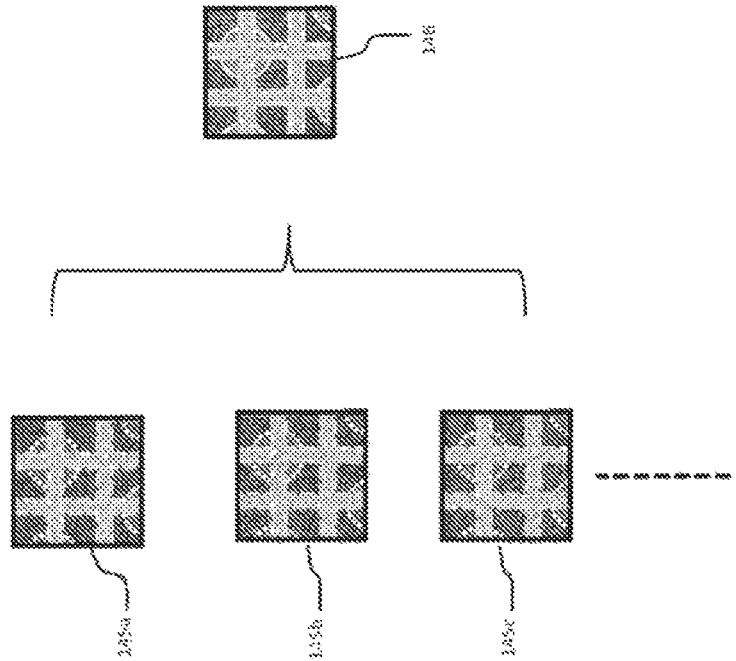
FIG. 18B
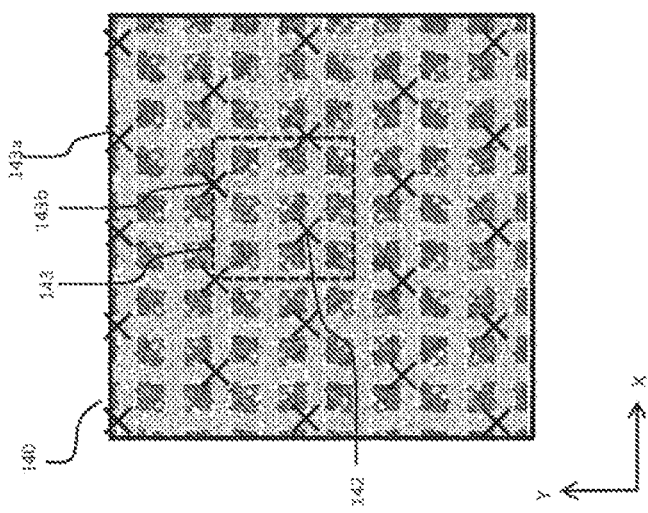
FIG. 18A

SUPERPOSITION MEASURING APPARATUS, SUPERPOSITION MEASURING METHOD, AND SUPERPOSITION MEASURING SYSTEM

TECHNICAL FIELD

The present invention relates to a measuring technology used in a semiconductor device production process and, more particularly, to a superposition measuring technology for measuring a superposition misalignment between processes.

BACKGROUND ART

A semiconductor device is produced by repeating a process of transferring, on a semiconductor wafer, a pattern formed on a photomask through lithographing and etching. In the semiconductor device production process, quality of the lithographing, etching, or other processing, presence/absence of occurrence of foreign matters, and the like significantly influence yield of the semiconductor device. Thus, in order to detect occurrence of such abnormality or defect in the production process in an early stage or in advance, the pattern on the semiconductor wafer is measured or inspected during the production process.

Particularly, along with recent advancement of miniaturization and three-dimensionalization of the semiconductor device, management of pattern superposition between different processes has become increasingly important. In a conventional approach, a position of the pattern formed in each process is measured from a reflecting light obtained by irradiating the semiconductor device through a dedicated pattern with light, whereby a superposition error of the pattern between different processes is calculated.

However, there is now required a more highly accurate superposition management due to decrease in a superposition tolerance associated with the miniaturization of the semiconductor. Although only an offset amount of the whole shot is managed for each shot in the conventional approach, a variation in the superposition misalignment amount in each shot caused by characteristics of an exposure device cannot be ignored at present. Further, there is a need to take into consideration influence of a machining process other than the exposure, such as inclination of an etching hole.

To respond to such a need, a superposition measuring means that uses an actual process pattern of the semiconductor device by a scanning electron microscope (SEM) is proposed. For example, PTL 1 describes a technology that measures a superposition error between different layers using the scanning electron microscope.

CITATION LIST

Patent Literature

PTL 1: JP 2011-142321 A (U.S. Pat. No. 8,148,682)

SUMMARY OF INVENTION

Technical Problem

When the scanning electron microscope is used to measure the superposition error between an upper-layer pattern and a lower-layer pattern, an SN (signal-to-noise ratio) of the lower-layer pattern may often be lower, so that when conventional simple frame adding processing is used, the adding processing needs to be performed many times in order to increase the SN of the lower-layer pattern and to enhance superposition measurement accuracy. Further, in an image obtained through such simple adding processing, contrast may not be optimal for both the upper-layer and lower-layer patterns.

Solution to Problem

To solve the above problem, the present invention provides a superposition measuring apparatus and superposition measuring method that measure a difference between a position of an upper-layer pattern of a sample and a position of a lower-layer pattern thereof by using an image obtained by irradiation of a charged particle ray. In this apparatus and method, portions of images having contrasts optimized for the respective upper-layer and lower-layer patterns are added to generate a first added image optimized for the upper-layer pattern and a second added image optimized for the lower-layer pattern, and the difference between the position of the upper-layer pattern identified by using the first added image and position of the lower-layer pattern identified by using the second added image is calculated.

Advantageous Effects of Invention

According to the present invention, position measurement is performed for images in which contrast is optimized for the respective upper-layer and lower-layer patterns, so that it is possible to achieve superposition measurement between different layer processes of semiconductors with high accuracy.

Other problems, configurations and effects will be apparent by description of the following embodiments.

BRIEF DESCRIPTION OF DRAWINGS

FIGS. 4A-4C are explanatory views each illustrating a flow of a superposition measurement process of the first and second embodiments.

FIG. 14 is an explanatory view of a result file created in the superposition measurement of the first and second embodiments.

FIGS. 18A and 18B are explanatory views of the added image creation method for the lower-layer pattern in the superposition measurement of the second embodiment.

DESCRIPTION OF EMBODIMENTS

Hereinafter, embodiments of the present invention will be described in detail with reference to the drawings.

Hereinafter, an example in which a scanning electron microscope is used will be described as an example of a superposition apparatus that measures a difference between a position of an upper-layer pattern of a sample and a position of a lower-layer pattern thereof by using an image obtained by irradiation of a charged particle ray. However, this is merely an example of the present invention, and the present invention is not limited to embodiments described below. In the present invention, a charged particle ray device includes a wide variety of devices that photograph an image of the sample using the charged particle ray. Examples of the charged particle ray device include a testing device, a review device, and a pattern measuring device that use a scanning electron microscope. Further, the present invention may be applied to a general-purpose scanning electron microscope, and a sample processing device and a sample analyzing device provided with the scanning electron microscope. The charged particle ray device includes a system in which the charged particle ray devices are connected to each other over a network and a composite device made up of a plurality of the charged particle ray devices.

In the present specification, "superposition measurement" is not limited to measurement of a superposition misalignment error between two layers, but includes measurement of a misalignment between three or more layers.

In the present specification, an example in which a "sample" is a semiconductor wafer on which a pattern is formed will be described, but the present invention not limited thereto.

First Embodiment

Figure 1:
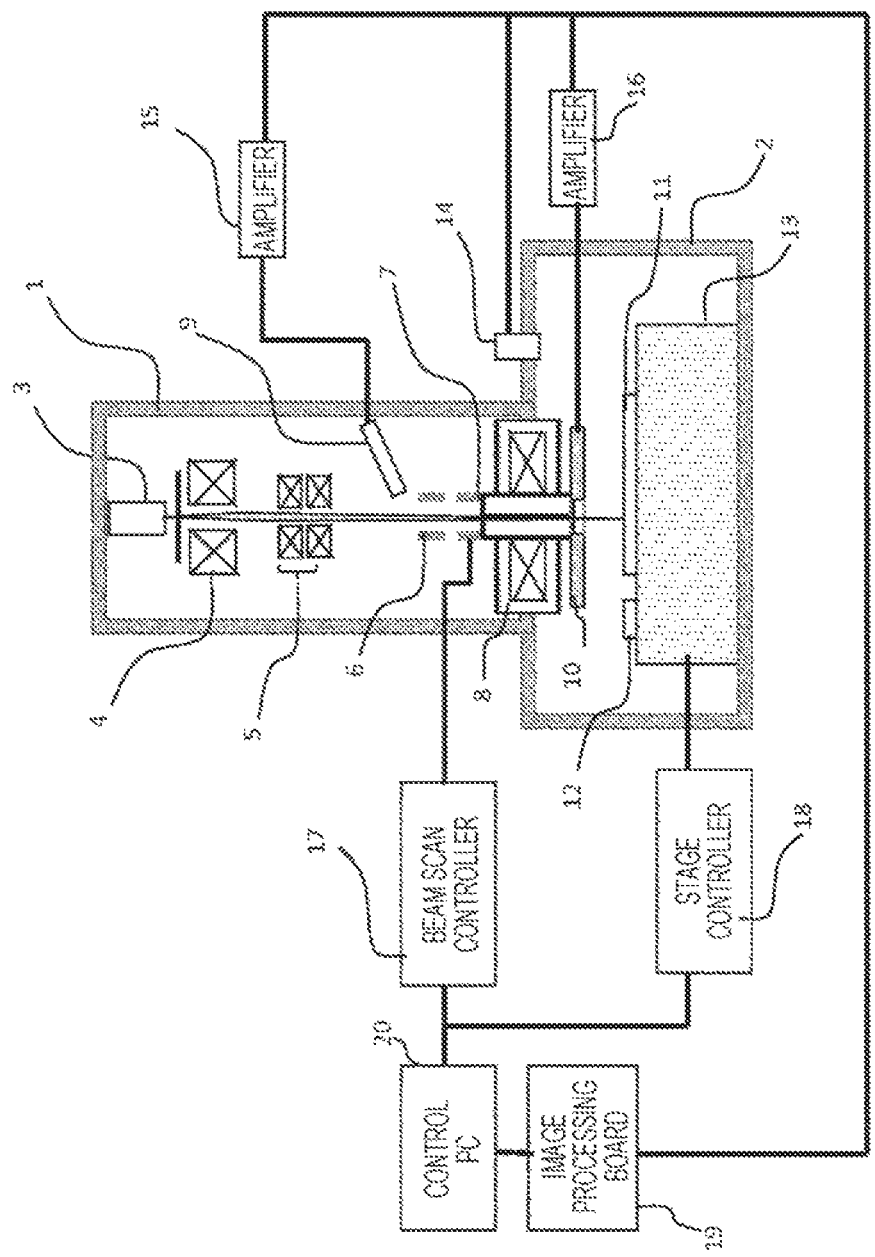
FIG. 1 is a schematic view illustrating a configuration of an apparatus illustrated in first and second embodiments.

FIG. 1 is a configuration diagram of a superposition measuring apparatus according to the present embodiment, and an apparatus body includes a column 1 which is an electron-optical system and a sample chamber 2. The column 1 includes an electron gun 3, a condenser lens 4, an objective lens 8, a deflector 7, an aligner 5, a secondary electron detector 9, an ExB filter 6, and a reflected electron detector 10. A primary electron beam (irradiation electron beam) generated by the electron gun 3 is irradiated to the wafer 11 while being converged by the condenser lens 4 and objective lens 8. The aligner 5 aligns a position at which the primary electron beam enters the objective lens 8. The primary electron beam is made to scan the wafer 11 by the deflector 7. The deflector 7 makes the primary electron beam scan the wafer 11 according to a signal from a beam scan controller 17. Secondary electrons obtained from the wafer 11 irradiated with the primary electron beam are directed to the secondary electron detector 9 by the ExB filter 6 to be detected by the secondary electron detector 9. Reflected electrons from the wafer 11 are detected by the reflected electron detector 10. The secondary electrons and reflected electrons, i.e., signals obtained from a sample irradiated with the electron beam, are collectively referred to as signal electrons. A charged particle optical system may include, in addition to the above components, other lenses, electrodes, and other detectors. Further, a part of the charged particle optical system may differ from the above one. That is, the configuration of the charged particle optical system is not limited to the above one. An XY stage 13 installed in the sample chamber 2 moves the wafer 11 with respect to the column 1 according to a signal from a stage controller 18. A standard sample 12 for beam calibration is attached onto the XY stage 13. The superposition measuring apparatus further includes an optical microscope 14 for wafer alignment. Signals from the secondary electron detector 9 and reflected electron detector 10 are signal-converted by amplifiers 15 and 16, and resultant signals are fed to an image processing board 19 to be imaged. Operation of the entire superposition measuring apparatus according to the present embodiment is controlled by a control PC 20. The control PC includes an input section, such as a mouse or a keyboard, for a user to input various instructions, a display section such as a monitor for displaying a screen, and a storage section such as a hard disk or a memory.

Although not illustrated, the charged particle ray device includes, in addition to the above components, a controller that controls operations of respective components and an image generation section that generates an image based on a signal output from the detectors. The controller and image generation section may each be embodied as hardware by using a dedicated circuit board and may each be composed of software executed by a computer connected to the charged particle ray device. When being composed of hardware, they can be realized by integrating a plurality of computing units that executes processing on a circuit board, on a semiconductor chip, or in a package. When being composed of software, they can be realized by mounting a high-speed general-purpose CPU in a computer and executing a program which executes desired arithmetic processing. By using a recording medium storing such a program, an existing apparatus can be upgraded. The above apparatus, circuit, and computer are connected to one another by a wired or wireless network, whereby data are exchanged as needed.

Figure 2B:
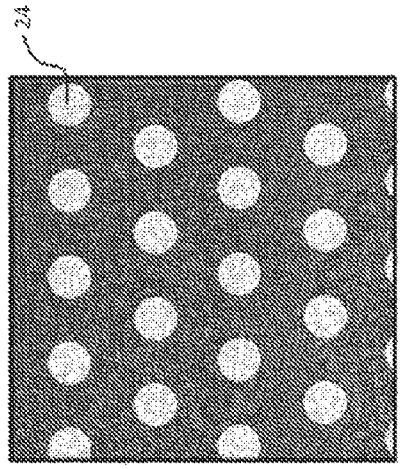
FIGS. 2A-2D are explanatory views of sample to be measured in the first and second embodiments.
Figure 2D:
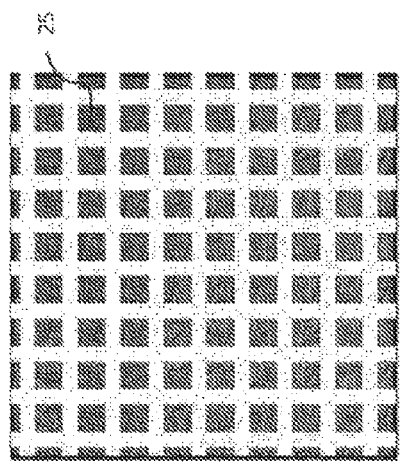
Figure 2A:
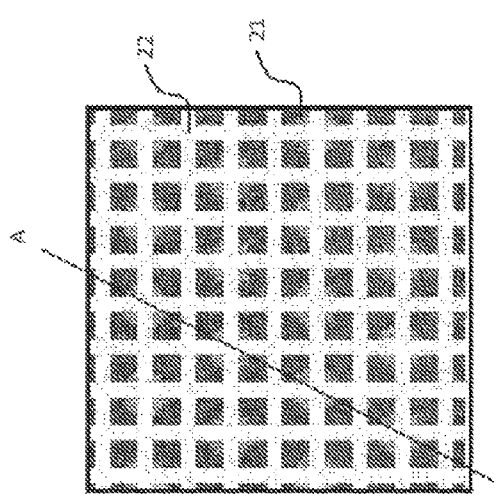
Figure 2C:
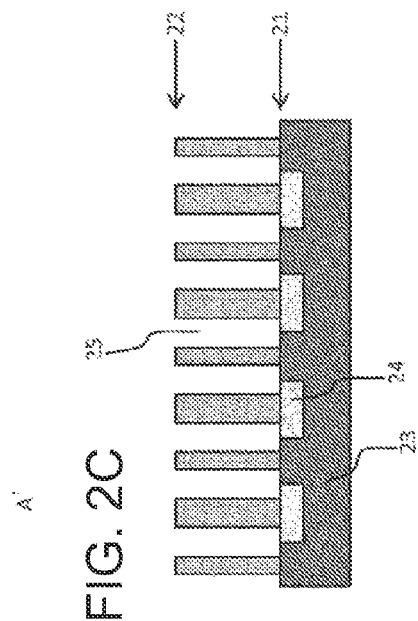

Hereinafter, a structure of a silicon wafer sample for which the superposition measurement is performed in the present embodiment will be described by FIGS. 2(a) to 2(d). FIG. 2(a) is an image obtained by observing the sample using a scanning electron microscope. In FIGS. 2(a) to 2(d), an upper layer 22 has a shape in which rectangular opening portions are arranged, and circular patterns of a lower layer 21 are partly viewed at hole bottoms of the rectangular pattern. FIG. 2(b) is a cross-sectional view taken along a line A-A' of FIG. 2(a). The lower layer 21 has a structure having a silicon pattern 24 in a silicon oxide 23, and the upper layer 22 has a structure in which rectangular holes 25 are formed in a silicon oxide film. FIG. 2(c) is an exemplary view illustrating an arrangement of the silicon pattern 24 in the lower layer 21. FIG. 2(d) is an exemplary view illustrating a pattern arrangement of the rectangular holes 25 in the upper layer 22.

The rectangular holes 25 are each filled with a conductive material in a subsequent process for plug formation. In FIG. 2(a), the upper layer 21 and lower layer 22 are well superposed to each other, and a part of the silicon pattern 24 is viewed inside each hole 25. In this case, upon the plug formation, each plug is brought into electrical contact with the silicon pattern 25 at an adequate resistance value.

Figure 3:
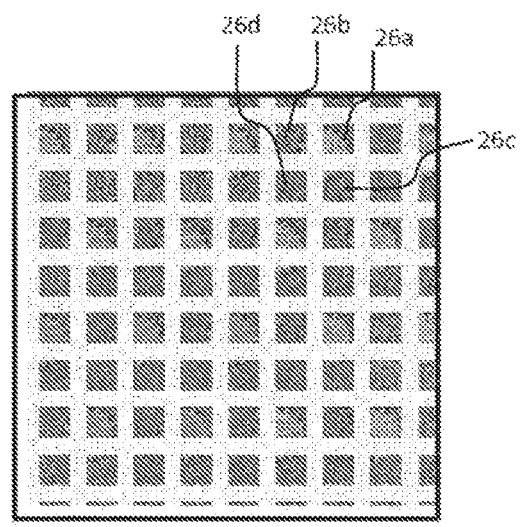
FIG. 3 is an explanatory view illustrating a state where a misalignment occurs in the sample to be measured in the first and second embodiments.

FIG. 3 illustrates a case where a misalignment occurs in the superposition of the upper layer 22 with respect to the lower layer 21. In a rectangular hole 26a, a sufficient silicon pattern 24 exists at the hole bottom surface, so that it is possible to establish adequate electrical contact between the plug and the lower layer when the plug is formed. However, in each of rectangular holes 26b and 26c, an area of the silicon pattern 24 at the hole bottom surface is small, so that a contact portion between the plug and the silicon pattern 24 when the plug is formed becomes higher than a normal value. In a rectangular hole 26d, since no silicon pattern 24 exists at the hole bottom surface, electrical contact between the plug and silicon pattern may not established. As described above, if the superposition misalignment has occurred, a device to be finally produced may fail to operate normally.

Hereinafter, a procedure of superposition measurement 31 between layers in the present embodiment will be described using FIGS. 4(a) to 4(c). A wafer for which the superposition measurement is performed is loaded (step 32). Then, a wafer alignment point set by the optical microscope and SEM is registered (step 33), and alignment is executed. The alignment is a process of associating a wafer coordinate system and an apparatus coordinate system using the position of the registered pattern point as a reference.

Thereafter, a template for adding processing of a repeated pattern is registered (step 34), and a superposition measurement point on the wafer is registered (step 35). The template in step 34 is an image to be used as a reference for identifying a position of a pattern to be subjected to overlay measurement, as described later. In step 35, an acquisition position of an image including the overlay measurement target pattern is registered. A pattern that matches the registered template is searched for in the image including the overlay measurement target patterns, and images at matched positions are subjected to adding processing. This processing will be described in detail later. With the above processes, a recipe for the superposition measurement is created. In subsequent processes, the measurement is performed according to the created recipe.

When the recipe is executed, a first measurement point is reached (step 36), and an image is acquired (step 37) under a condition specified upon the template registration (step 34). Then, a high SN image is created by addition of the same pattern portions in the acquired image, and a misalignment amount is calculated (step 38). It is determined whether or not all the points registered in the recipe have been measured (step 39). When any measurement point remains, the image acquisition and misalignment amount calculation are executed at the next measurement point. When the measurement at all the measurement point is completed, wafer is unloaded (step 40), and a measurement result is output (step 41). Hereinafter, details of the individual processes will be described along flowcharts of FIGS. 4(b) and 4(c).

First, along the flowchart of FIG. 4(b), a detailed procedure of the template registration in step 34 will be described by FIGS. 5 and 6. A map display area 52 and an image display area 53 are disposed on a GUI 51 of FIG. 5. In the map display area 52, wafer map display and shot map display can be switched therebetween by a wafer map select button 54 and a shot map select button 55. FIG. 6 is a view explaining internal processing of the image processing board 19 and control PC 20. A GUI control unit 76 and an information storage unit are disposed in the control PC 20, and an image storage unit 77 and an image processing unit 79 are disposed in the image processing board 19. The functional blocks illustrated in FIG. 6 are connected to one another via information lines.

Figure 5:
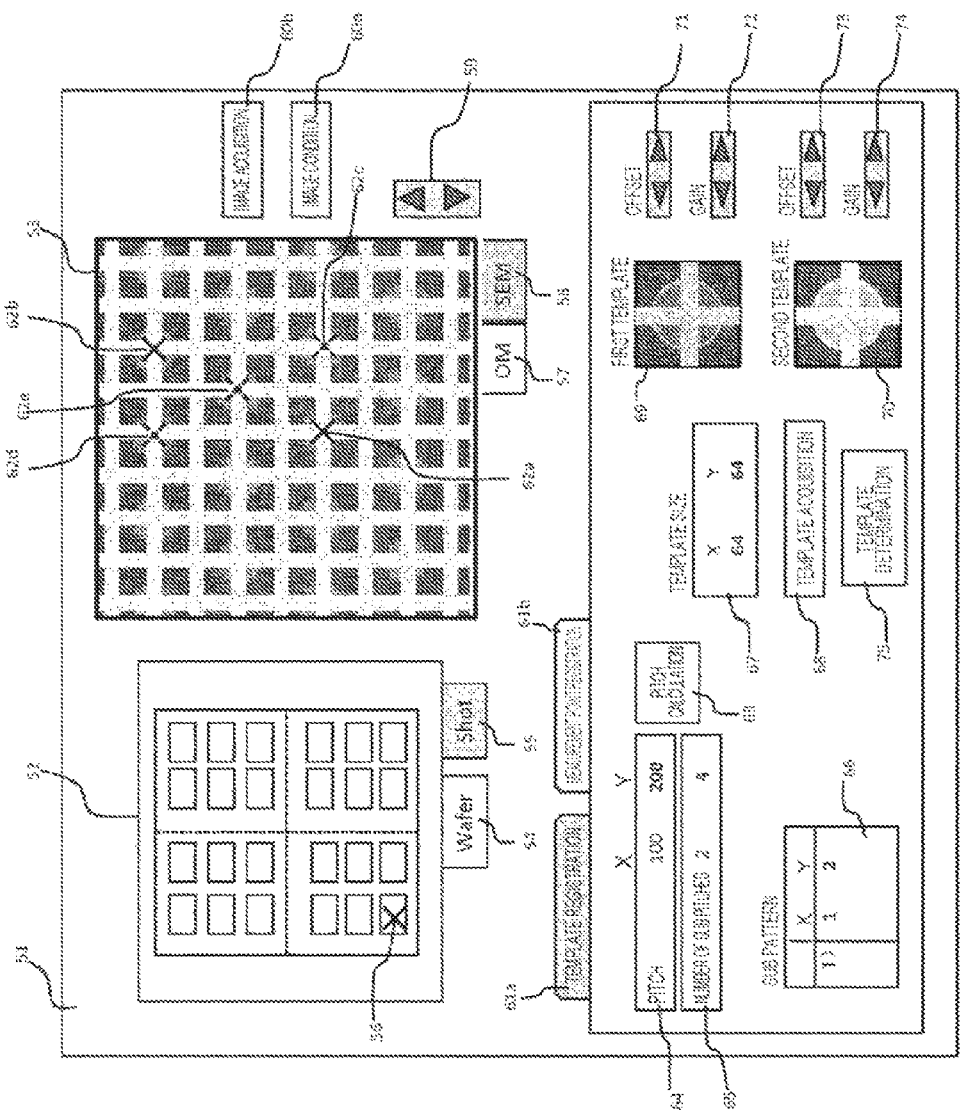
FIG. 5 is an explanatory view of a template registration method using a GUI of a superposition measuring apparatus of the first and second embodiments.
Figure 6:
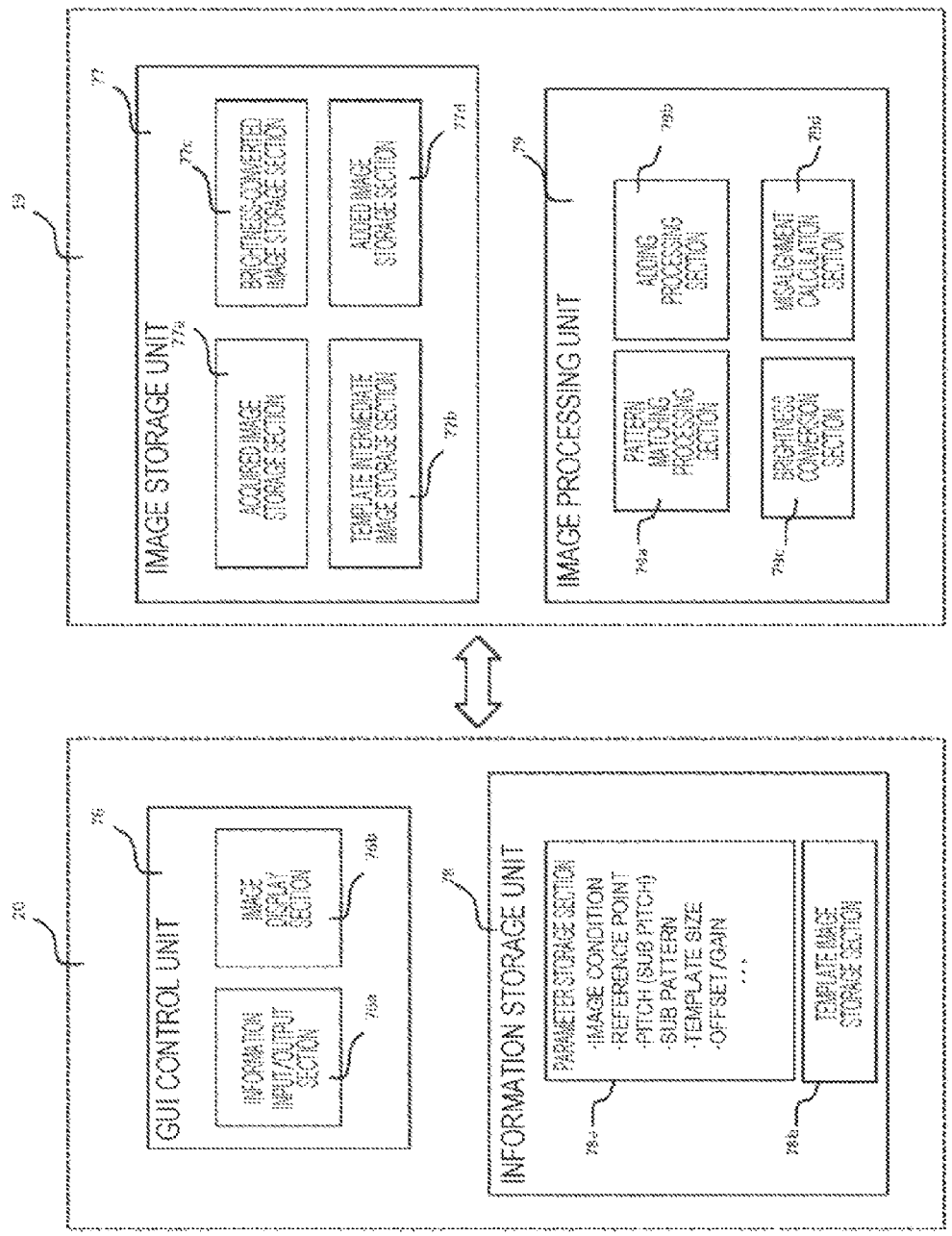
FIG. 6 is an explanatory view of an image processing function of the superposition measuring apparatus of the first and second embodiments.

In FIG. 5, the shot map is selected, and the shot map select button 55 is highlighted. When the shot map is clicked in this state, the wafer is moved to the image acquisition position in the shot by the stage (step 34a). In the image display area 53, an optical microscope image display and a SEM image display can be switched therebetween by an optical microscope image select button 57 and a SEM image select button 58. A display magnification can be changed by using a display magnification change button 59. Other image acquisition conditions is set by clicking an image condition setting button 60a to start up an image condition setting window and the image condition is stored in a parameter storage section 78a of the information storage unit 78 via an information input/output section 76a of the GUI control unit 76. By clicking an image acquisition button 60b, an image is acquired under the set image conditions. The acquired image is stored in an acquired image storage section 77a of the image storage unit 77 and displayed on the GUI via the image display section 76a (step 34b).

The template is registered by selecting a pattern in the image display area 53 with a template registration tab 61a being selected. A reference point 62a to be registered as the template is selected in the vicinity of a center of the image (step 34c) and then, a reference point 62b shifted from the reference point 62a by one period is selected (step 34d). When a pitch calculation button 63 is clicked in this state, a pitch between the selected two points is calculated by the GUI control unit 76 and displayed on a pitch display section 64, and pitch information is stored in the parameter storage section 78a (step 34e). The pitch refers to a period at which the same pattern is repeated in both the upper and lower layers. To a sub pitch registration section 65, the number of pitches of the upper-layer pattern between the points 62a and 62b is input. That is, when focusing only on the upper-layer pattern, the sub pitch refers to a repetition period of the upper-layer pattern. In this example, two rectangular opening portions exist in a lateral direction and four rectangular opening portions exist in a longitudinal direction and, thus, 2 and 4 are input as the number of sub pitches of X and that of Y, respectively (step 34f). The same pattern as the reference point is repeated on a per-pitch basis; however, there may be other portions having the same pattern as the reference point. Such a portion is referred to as a sub pattern, and a user inputs a position of the sub pattern to a sub pattern registration section 66 in a sub pitch unit (step 34g). In the present embodiment, a point 62e shifted from the point 62a by one pitch in the X-direction and two pitches in the Y-direction is registered as the sub pattern. After confirmation that cross marks are made at positions having the same pattern as the reference point by referring to the image display area 53, a size of the template is set in pixels to a template size registration area 67 (step 34h), and a template acquisition button 68 is clicked (step 34i). With this, the positions of the same patterns in cutout images of the points 62a to 62e are accurately identified in a pattern matching section 79a of the image processing unit 79, and an added image is created in an adding processing section 79b. The added image is stored in a template intermediate image storage section 77b, and a template 69 and a template 70 are displayed respectively on the GUI via the image display section 76b.

Figure 7A:
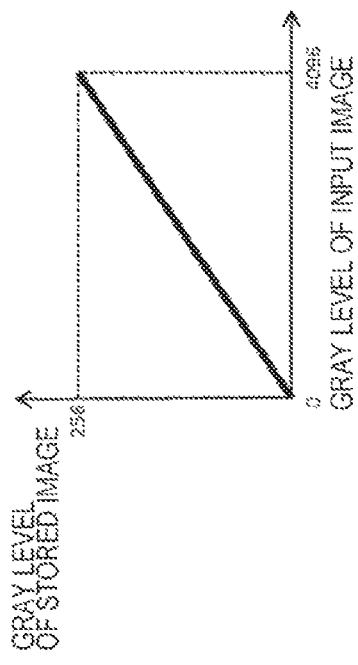
FIGS. 7A-7C are explanatory views of an image contrast optimization method in the superposition measurement of the first embodiment.
Figure 7C:
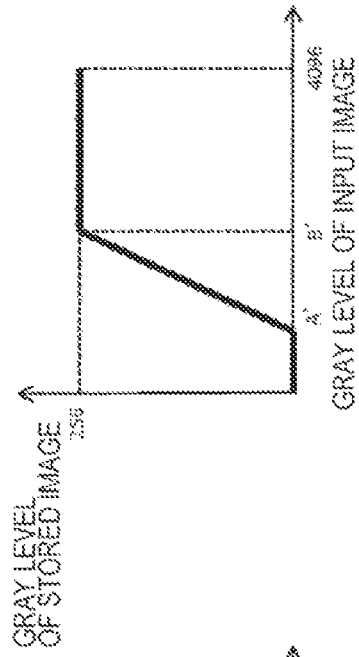
Figure 7B:
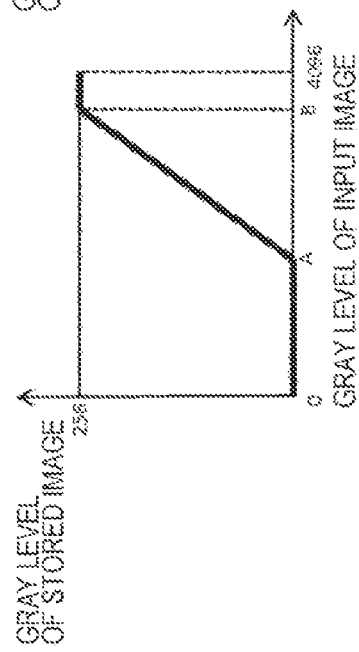

The template 69 (first template image) is an image obtained by adjusting an offset and a gain of a luminance value so that the contrast is optimized for the upper layer has. Specifically, a user operates an offset adjustment button 71 and a gain adjustment button 72 to adjust a conversion table as illustrated in FIGS. 7(a) to 7(c) (step 34j). The template 70 (second template image) is an image obtained by adjusting an offset and a gain of a luminance value so that the contrast is optimized for the lower layer. Specifically, a user operates an offset adjustment button 73 and a gain adjustment button 74 to adjust the conversion table as illustrated in FIGS. 7(a) to 7(c) (step 34k). The contrast adjustment for the template 69 and that for the template 70 can be carried out independently.

As the conversion table, two conversion tables for the respective upper-layer and lower-layer patterns are stored in a brightness conversion section 79b in the image processing unit 79. By default, 12 bits are linearly converted to 8 bits as illustrated in FIG. 7(a). When the offset and/or gain is changed in step 34j and step 35k, the conversion table of the brightness conversion section 79b is updated based on the changed offset and/or gain, and a template image that has been subjected to the brightness conversion is re-created. The template image is stored in the template intermediate image storage section 77b and is displayed on the GUI via the image display section 76b. Clicking a template determination button 75 causes the template image stored in the template intermediate image storage section 77b to be stored in a template image storage section 78b in the information storage unit 78 (step 34l).

As described above, during the recipe creation, the optimum table is created while the conversion table is updated. When the recipe operates, the conversion table created based on the recipe setting value (offset and gain) is stored in the brightness conversion section 79c at the start of the recipe, allowing the thus stored conversion table stored in the brightness conversion section 79c to be always used during operation of the recipe.

FIG. 7(b) is an explanatory view of the conversion table for the template 69. In FIG. 7(b), a point at which a signal value of an input image is A and a point at which the signal value of the input image is B are evenly assigned to signal values 0 to 256 in a stored image. Meanwhile, FIG. 7(c) is an explanatory view of the conversion table for the template 70. In FIG. 7(c), a point at which a signal value of an input image is A' and a point at which the signal value of the input image is B' are evenly assigned to signal values 0 to 256 in a stored image. FIGS. 7(b) and 7(c) are conversion tables which emphasizes a bright pattern in the upper layer and a dark pattern in the lower layer, respectively.

In the present embodiment, images having the optimum contrasts for the upper-layer and lower-layer patterns are created by changing the image contrast; alternatively, however, it is possible to obtain optimum images for the respective layers by using signals from different detectors. For example, for the upper-layer pattern, a signal from a secondary electron detector (SE detector) by which an edge portion is clearly imaged is used, while for the lower-layer pattern, a signal from a reflected electron detector (BSE detector) by which material contrast is easily obtained is used.

Figure 8:
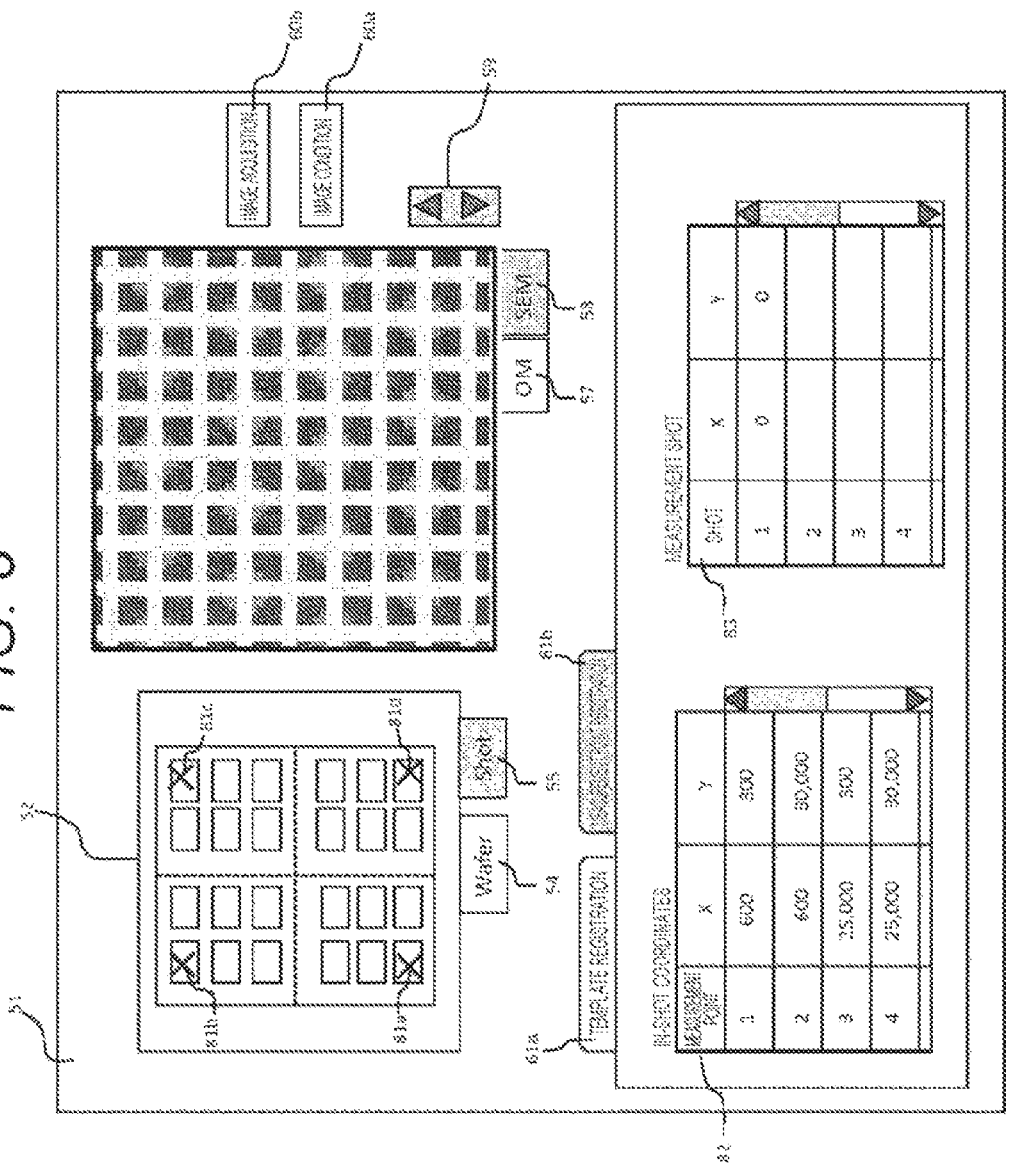
FIG. 8 is an explanatory view of a measurement coordinates registration procedure using the GUI of the superposition measuring apparatus of the first and second embodiments.

The following describes, by FIG. 8, a procedure of registering measurement coordinates in the shot. After a measurement point registration tab 61b is selected, the shot map select button 55 is clicked to display the shot map on the map display area 52. When the shot map is clicked in this state, an image corresponding to the clicked position is acquired. When the image displayed in the image display area is clicked, the clicked position on the image is registered as a superposition measurement position. Then, a cross mark is displayed on the shot map as the registered superposition measurement position, and registered coordinates are displayed in an in-shot coordinates display area 82. In the present embodiment, four measurement points 81a, 81b, 81c, and 81d displayed in the shot map of the map display area 52 are registered, and in-shot coordinates corresponding to the four measurement points 81a, 81b, 81c, and 81d are displayed in the in-shot coordinates display area 82. In a measurement shot display area 83, only an origin shot (0, 0) is selected as an initial state.

Figure 9:
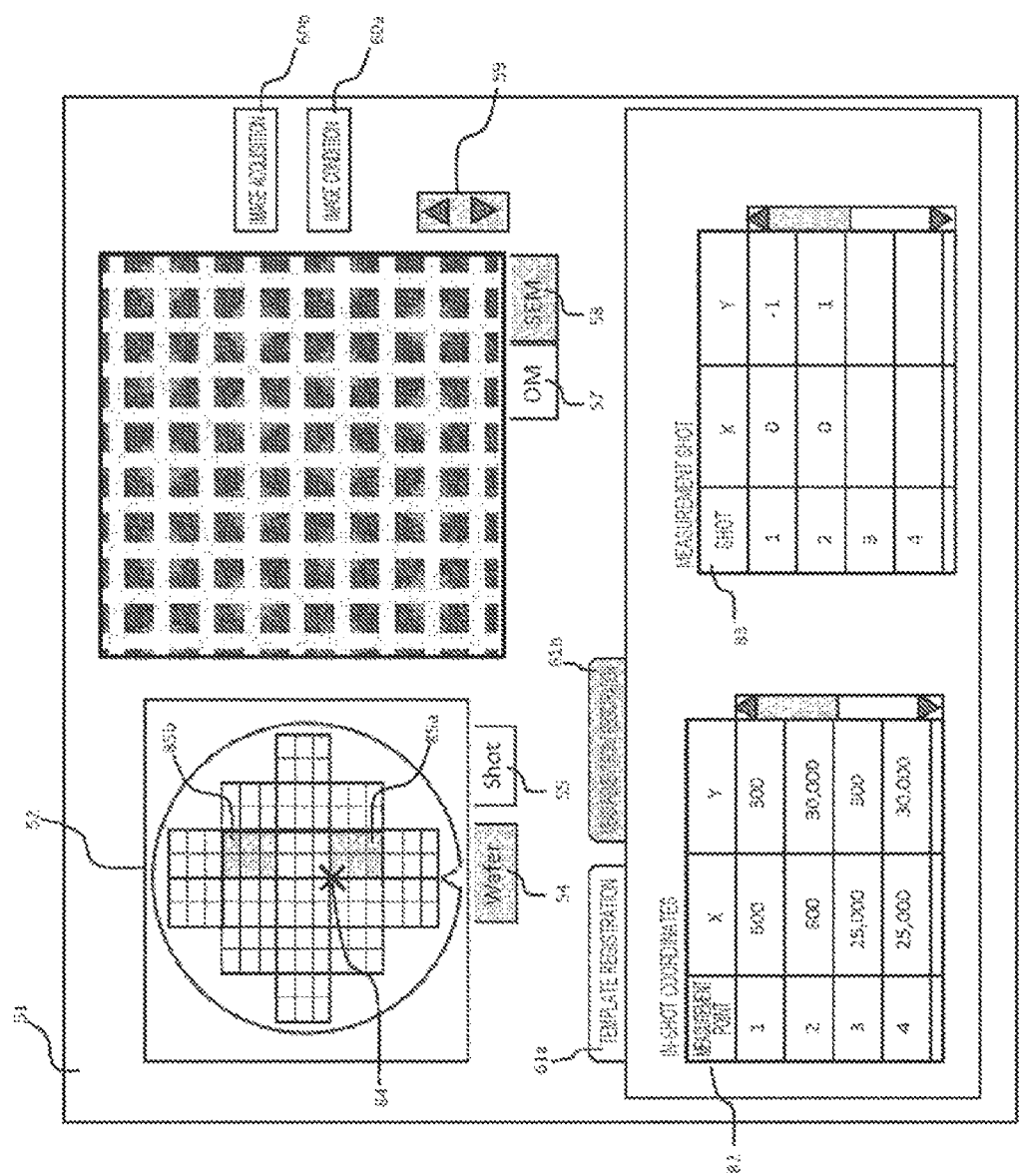
FIG. 9 is an explanatory view of a measurement shot registration method using the GUI of the superposition measuring apparatus of the first and second embodiments.

When the measurement shot needs to be changed, a wafer map is displayed by clicking the wafer map select button 54 as illustrated in FIG. 9, and a shot to be measured is selected on the wafer map. In FIG. 9, two shots 85a and 85b are selected. The selected shot can thus be confirmed in the measurement shot display area 83.

Figure 10:
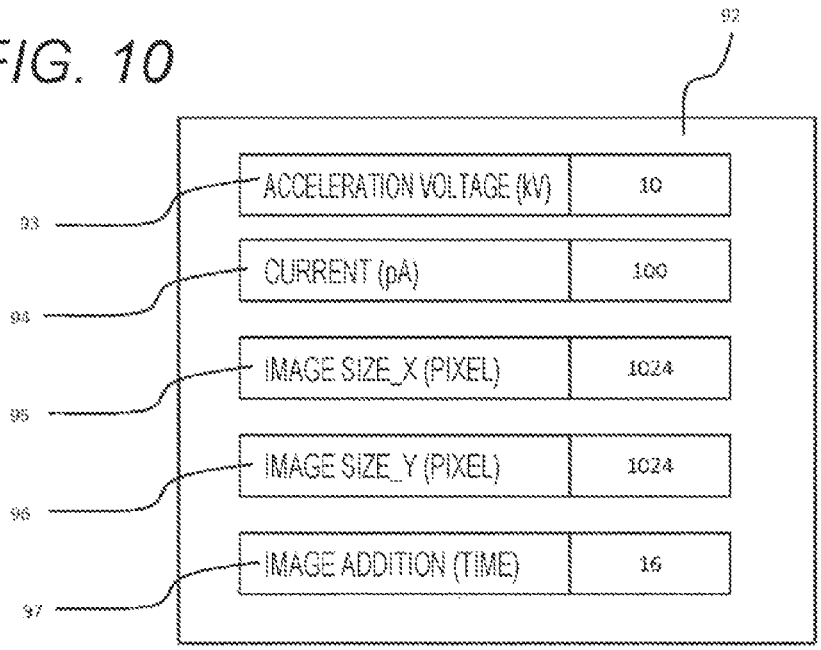
FIG. 10 is an explanatory view of an image condition setting method using the GUI of the superposition measuring apparatus of the first embodiment.

FIG. 10 illustrates an image condition setting window 92 to be displayed when an image condition setting button 60a is clicked. There are disposed, in the image condition setting window 92, an acceleration voltage setting area 93, a probe current setting area 94, an X-direction image size setting area 95 for setting the number of lateral direction pixels of a stored image in the image display area 53, a Y-direction image size setting area 96 for setting the number of longitudinal direction pixels of a stored image in the image display area 53, and an image adding frequency setting area 97.

The following describes, by FIGS. 11(a) to 11(c), FIGS. 12(a) to 12(c), FIGS. 13(a) to 13(c), and the flowchart of FIG. 4(c), a misalignment measurement procedure. An image size can be set, in units of 128 pixels, in a range from 512 pixels to 4096 pixels. In place of obtaining a high SN image by adding an image acquired in 512×512 pixels 16 times as in the time of the template creation, an image acquired in 1024×1024 pixels may be added four times in the superposition misalignment measurement. The image acquired in 1024×1024 pixels has a field of view four times wider than the image of 512×512 pixels, so that by adding the same pattern portions in the image of 1024×1024 pixels that has been subject to the adding processing four times, it is possible to obtain higher SN than that obtained by using the image of 512×512 that has been subject to the adding processing 16 times. In this case, a dosage of electrons to be irradiated to each portion on the wafer is reduced to one-fourth, thereby significantly reducing damage of the wafer.

After acquisition of an image under set conditions, the brightness conversion section 79c applies two different gray-level conversions to the one acquired image, thereby generating images in which the upper layer and lower layer have been optimized, respectively. Specifically, an image 90 (see FIGS. 11(a) to 11(c)) and an image 100 (see FIGS. 12(a) to 12(c)) obtained through conversion by the brightness conversion section 79c using the conversion table of FIG. 7(c) for enhancing the contrast of the lower layer and conversion table of FIG. 7(b) for enhancing the contrast of the upper layer, respectively, are stored in a memory of a brightness-converted image storage section 77c in the image storage unit 77 (step 38a). The image 90 has a contrast optimized for the lower-layer pattern, in which the luminance of the upper-layer pattern is saturated. On the other hand, the image 100 has a contrast optimized for the upper-layer pattern, in which the lower-layer pattern is excessively dark and difficult to recognize.

Figure 11A:
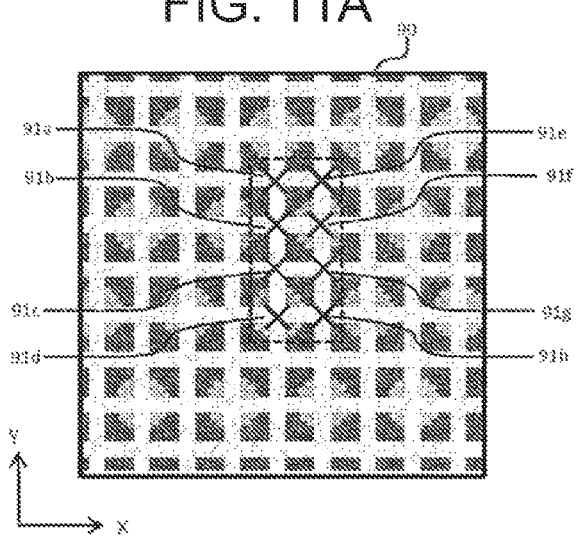
FIGS. 11A-11C are explanatory views of a reference position search method in the superposition measurement of the first embodiment.
Figure 11B:
Figure 11C:
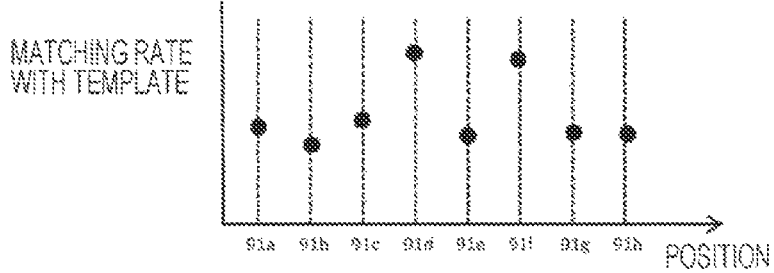

First, the template 70 (second template image) optimized for the lower-layer pattern is used to perform searching (matching) around a center of the image 90, for a position at which the same pattern as that of the template exists. Specifically, the pattern matching processing section 79a calculates, at the center portion of the image 90, a normalized correlation between the image 90 and template 70 in a range of a pattern pitch to obtain a position having a high correlation value (step 38b). In this case, as illustrated in FIG. 11(c), the highest correlation value is obtained at positions 91d and 91f at which the pattern completely coincides with the template, and the second highest correlation value is obtained at positions 91a, 91b, 91c, 91e, 91g, and 91h at which only the upper-layer pattern coincides with the template. The position 91d having the highest correlation value is set as a reference point for periodic pattern search. In this example, the positions 91d and 91f have the same pattern in terms of both the upper and lower layers and thus have almost the same correlation value; however, the matching rate of the position 91d is accidentally slightly higher due to influence of noise or the like.

Figure 12A:
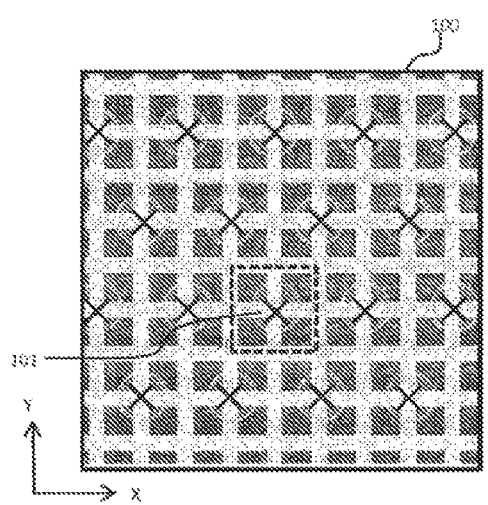
FIGS. 12A-12C are explanatory views of an added image creation method for an upper-layer pattern in the superposition measurement of the first embodiment.
Figure 12C:
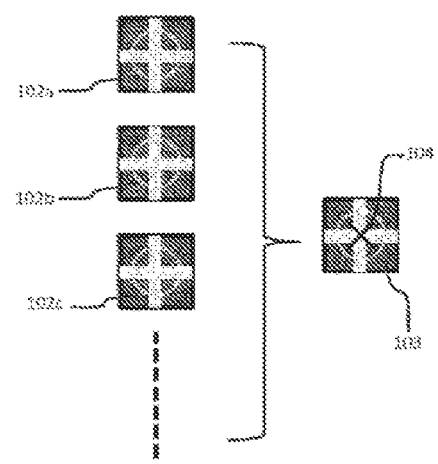
Figure 12B:
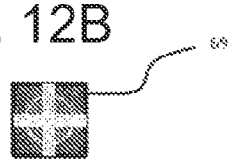

Then, the pattern matching processing section 79a performs searching (matching) in the image 100 of FIG. 12(a), for a position having the same pattern as that of the template 69 (first template image) with a position corresponding to the reference point set in the image 90 as a reference. Specifically, in the vicinity of the reference point set in the image 90, a position at which the normalized correlation value between the image 100 and template 69 becomes maximum is determined with accuracy equal to or less than a pixel size. The position in the image 100 at which the normalized correlation value with the template 69 becomes maximum can be regarded as the position having the same pattern as that of the template 69, so that a reference point 101 is changed to this position (step 38c). In the image 100 and template 69, only the upper-layer pattern is clearly viewed. This allows the matching with the template to be performed without being influenced by the lower-layer pattern having lower SN and, as a result, allows the matching position to be obtained with accuracy equal to or less than a pixel size.

After setting of the reference point in the image 100, a position at which the normalized correlation value with the template becomes maximum is searched for in the vicinity of a point having the following positional relation with the reference point 101 (step 38d):

$$\{Tx+N\cdot Px, Ty+N\cdot Py\} \qquad \text{I:}$$

$$\{Tx+(N+\tfrac{1}{2})\cdot Px, Ty+(N+\tfrac{1}{2})\cdot Py\} \qquad \text{II:}$$

where pixel-based coordinates of the reference point on the image is (Tx, Ty), pixel-based pattern periods in the X- and Y-directions are Px and Py, respectively, and M and N are integer numbers.

When the point 62a is set as the reference point in the image display area of FIG. 5, the above I represents a series of positions shifted from the point 62a in the up, down, left and right directions by an integer multiple of the pitch. The above II represents a series of positions shifted from a point having a positional relationship with the reference point equal to that between the point 62e and reference point in the up, down, left and right directions by an integer multiple of the pitch.

A plurality of positions at which the correlation value becomes maximum are identified by the pattern matching processing section 79a, and images 102a, 102b, 102c, . . . (first partial images) cut out from the identified positions (first portions) are added by the adding processing section 79b to generate an added image 103 (first added image). The added image 103 is stored in an added image storage section (step 38e). A misalignment calculation section 79d uses the added image 103 to calculate a center position 104 of the cross pattern of the upper layer (step 38f). The images 102a, 102b, 102c, . . . and added image 103 are images each in which the contrast is optimized for the upper layer, so that the center position 104 of the cross pattern of the upper layer can be calculated with high accuracy. The "center position of the pattern" is not limited to the geometric center position, but may be a centroid position, or may be a predetermined position uniquely identified from the pattern shape.

Figure 13C:
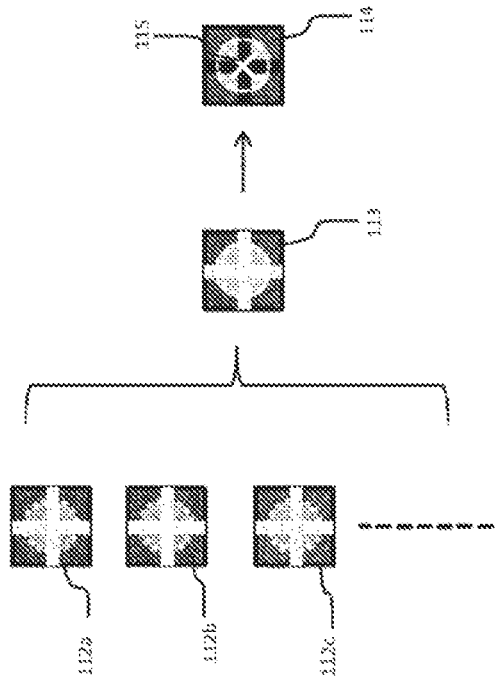
FIGS. 13A-13C are explanatory views of an added image creation method for a lower-layer pattern in the superposition measurement of the first embodiment.
Figure 13A:
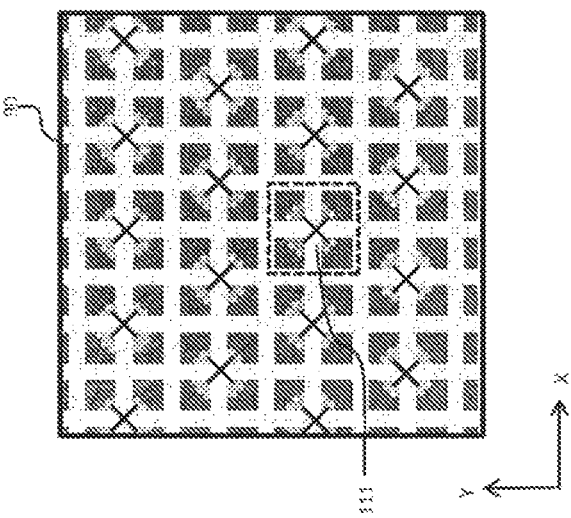
Figure 13B:
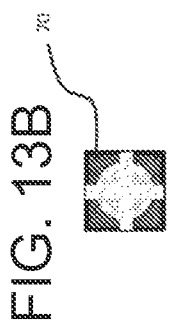

Similarly, as illustrated in FIGS. 13(a) to 13(c), a plurality of positions (second portions) in the image 90 that correspond to the positions having the maximum correlation value in the image 100 (i.e., images 102a, 102b, 102c, . . . ) are identified. Images 112a, 112b, 112c, . . . (second partial images) cut out from the identified positions are added by the adding processing section 79b to generate an added image 113 (second added image) of the lower-layer pattern image. The added image 113 is stored in the added image storage section (step 38g). The images 112a, 112b, 112c, . . . and added image 113 are contrast-adjusted such that the lower-layer pattern is clearly viewed, so that by identifying the position of the lower-layer pattern using the added image 113, the position measurement can be made with high accuracy.

However, the added image 113 includes the upper-layer pattern, which may prevent the center position of the lower-layer pattern from being calculated with accuracy. Thus, an image 114 in which the upper-layer pattern having a brightness value equal to or larger than a threshold value has been masked out is created using information of the upper-layer pattern position obtained from the added image 103 in which the contrast is optimized for the upper-layer pattern (step 38h). The misalignment calculation section 79d uses the image 114 to calculate a center position 115 of the lower-layer pattern (step 38i). Both the mask processing in step 38h and center position calculation in step 39i are executed in the misalignment calculation section 79d. Although a size of the cut out image is set equal to the size of the template in the present embodiment, an image having a size different from the size of the template may be cut out. The superposition misalignment amount is calculated, according to the following expressions, from the pixel-based center position 103 (Mx, My) of the upper-layer pattern, pixel-based center position 115 (Nx, Ny) of the lower-layer pattern, and a pixel size S (step 38j).

misalignment amount in X-direction: $(Mx-Nx)\cdot S$ misalignment amount in Y-direction: $(My-Ny)\cdot S$ After completion of measurement at all the measurement points, a measurement result file 120 illustrated in FIG. 14 is output. The added images 103 and 113 at respective measurement points may be stored in association with the measurement result file, and may be used for a purpose such as verifying whether the superposition measurement is normally performed.

Second Embodiment

Hereinafter, a modification of the first embodiment will be described in a second embodiment. Unless otherwise specified, the apparatus configuration, structure of the target sample, measurement process, and GUI configuration in the second embodiment are the same as those in the first embodiment.

In the first embodiment, the search for reference position by the lower-layer pattern is performed in step 38*b*; however, the search may be difficult to achieve depending on the SN of the lower-layer pattern. Thus, in the second embodiment, images are cut out each in a size that inevitably includes the lower-layer pattern shown in the template 70 and then the adding processing is preformed, thereby eliminating the need to perform the lower-layer pattern search step.

Figure 15:
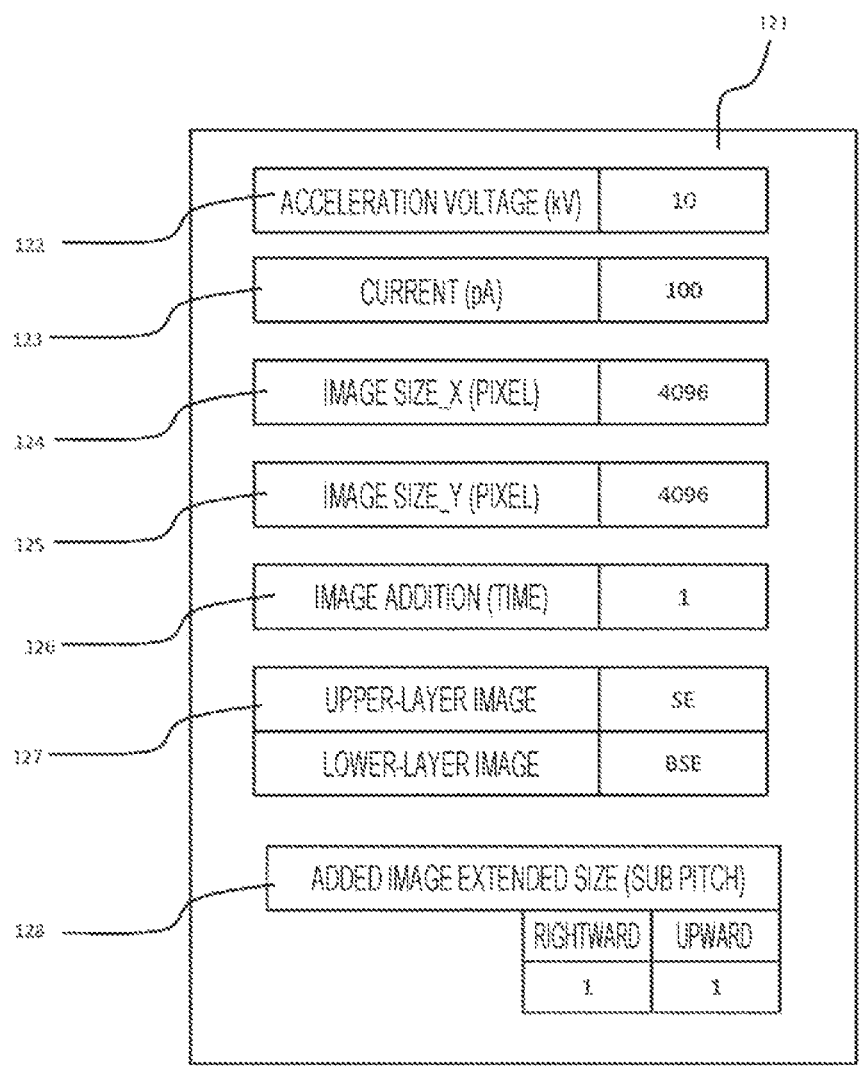
FIG. 15 is an explanatory view of the image condition setting method using the GUI of the superposition measuring apparatus of the second embodiment.

As illustrated in FIG. 15, there are disposed in an image condition setting window 121 of the second embodiment, an acceleration voltage setting area 122, a probe current setting area 123, an X-direction image size setting area 124, a Y-direction image size setting area 125, an image adding frequency setting area 126, a detector selection area 127, and an added image extension size setting area 128.

In the second embodiment, the same pattern portions in the image obtained by a single addition of an image of 4096× 4096 pixels are added. In the first embodiment, the image of 1024×1024 pixels is added four times; while in the present embodiment, only a single addition is performed, thereby further reducing the dosage of electrons to be irradiated to the same area on the wafer, which can significantly reduce damage of the wafer. When the X-direction and Y-direction pattern pitches are 100 pixels and 200 pixels, respectively, the number of repeated patterns to be added is calculated as follows.

(number of additions)=(number of pitches in *X*-direction)×(number of pitches in *Y*-direction)×(target pattern in pitch)

The number of pitches in the X-direction is 40 (i.e., an integer part of 4096/100), the number of pitches in the Y-direction is 20 (i.e., an integer part of 4096/200), and the number of target patterns in the pitch is 2 (i.e., 1+the number of sub patterns). Thus, the number of additions is 160, with the result that the SN can be enhanced by 13 times as compared with that of the image before addition (image of 4096×4096 pixels).

In the detector selection area 127, optimum detections for respective the upper- and lower-layer patterns are selected. In the second embodiment, the secondary electron detector is selected for the upper-layer pattern, and the reflected electron detector is selected for the lower-layer pattern. Further, in the second embodiment, an extension amount of the image to be added with respect to the template size is set to the added image extension size setting area 128 in units of the pitch of the upper-layer pattern (i.e., in units of sub pitch) such that the pattern of the template 70 of FIG. 5 falls within the added image without fail.

Hereinafter, an added image extension amount determination method will be described by FIGS. 11(*a*) to 11(*c*). The user can determine the extension amount according to the following method while confirming the pattern images formed in the upper and lower layers in the template registration flow illustrated in FIG. 4(*b*). Alternatively, the user can previously grasp the patterns to be formed in the upper and lower layers from design data and can thus determine the extension amount according to the following method.

When the position 91*a* or 91*g* is selected as the reference position, the pattern of the template 70 is situated at a position shifted upward in FIG. 11(*a*) from the reference point by one sub pitch. Accordingly, a required extension amount is one sub pitch in the upper direction. Similarly, when the position 91*b* or 91*h* is selected, the required extension amount is one sub pitch in the right direction, and when the position 91*c* or 91*e* is selected, the required extension amount is one sub pitch in the upper direction and one sub pitch in the right direction.

When the position 91*d* or 91*f* is selected, the expansion is not required since it has the same lower-layer pattern as that of the template 70. Thus, when the lower-layer pattern is formed as illustrated in FIG. 11(*a*), even if any position in the upper-layer pattern is selected as the reference position, an image extended by one sub pitch in the upper direction and one sub pitch in the right direction includes the same pattern as that of the template 70 without fail.

The above can be summarized as follows. A distance from each of the virtual reference points arbitrarily set on the sample to a position closest to a position at which the upper and lower layers have the same pattern as that of the template is calculated, and a view range of the image to be added is extended by the maximum distance among the calculated plurality of distances. As a result, the image having a size larger than that of the template by the maximum distance is subjected to the adding processing. Although the image to be added is extended relative to the template size by one sub pitch in the above example, the extension amount differs depending on the pattern of the sample. Whatever pattern the sample has, it is possible for the image to be added to include the same pattern as that of the template 70 when it is extended so as to have a view range equal or larger than at least one pitch.

Figure 16:
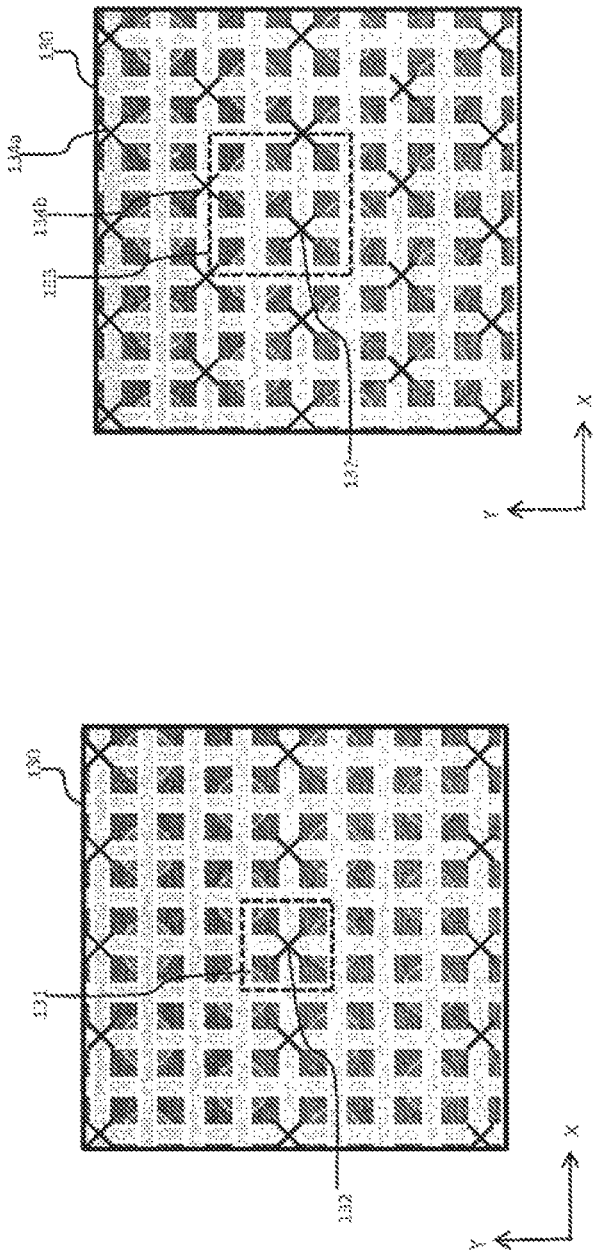
FIGS. 16A and 16B are explanatory views of the reference position search method in the superposition measurement of the second embodiment.
Figure 17:
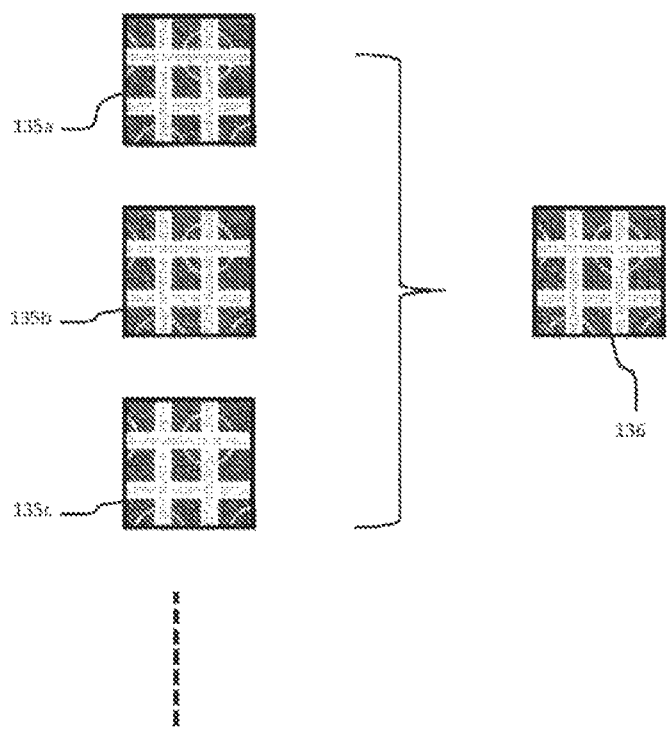
FIG. 17 is an explanatory view of the added image creation method for the upper-layer pattern in the superposition measurement of the second embodiment.

The following describes, by FIGS. 16(*a*) and 16(*b*), FIG. 17, and FIGS. 18(*a*) and 18(*b*), the misalignment measurement procedure in the second embodiment. After acquisition of an image under set conditions, an image 130 (see FIGS. 16(*a*) and 16(*b*)) detected by the secondary electron detector and an image 140 (see FIGS. 18(*a*) and 18(*b*)) detected by the reflected electron detector are stored in a memory of the apparatus. First, the template 69 optimized for the upper-layer pattern is used to search, around a search area 131 in the vicinity of a center of the image 130, for a position at which the same pattern as that of the template exists. Specifically, at the center portion of the image 130, a normalized correlation between the image 130 and template 69 is calculated in a range of a pattern pitch to obtain a position having a high correlation value as a reference point 132. The second embodiment assumes a case that the SN of the lower-layer pattern is insufficient and, thus, it is difficult to search the position in the original image that coincides with the template including the lower-layer pattern. Thus, at the reference point 132, the lower-layer pattern differs from that in the template 69; however, even in such a case, it can be coped with by sufficiently increasing the size of the added image such that the same image as the template is included in the added image.

Then, in the vicinity of a point included in the image 130 and having the following positional relation with the reference point 132, a position at which the normalized correlation value between the image 130 and template 69 becomes maximum is searched.

$$\{Sx+N\cdot Px, Sy+N\cdot Py\} \quad \text{I:}$$

$$\{Sx+(N+\tfrac{1}{2})\cdot Px, Sy+(N+\tfrac{1}{2})\cdot Py\} \quad \text{II:}$$

where pixel-based coordinates of the reference point 132 on the image is (Sx, Sy), pixel-based pattern periods in the X- and Y-directions are Px and Py, respectively, and M and N are integer numbers.

When the point 62*a* is set as the reference point in the image display area of FIG. 5, the above I represents a series of positions shifted from the point 62*a* in the up, down, left and right directions by an integer multiple of the pitch. The above II represents a series of positions shifted from a point having a positional relationship with the reference point equal to that between the point 62e and reference point in the up, down, left and right directions by an integer multiple of the pitch. The I is a point like a point 134a, II is a point like a point 134b, which are marked by X in the image 130 of the second embodiment.

An image having a size defined by the added image size setting area 128 is cut out from the position having the maximum correlation value, followed by the adding processing. In the second embodiment, an image obtained by extending the template size by one sub pitch in the upper direction and one sub pitch in the right direction is cut out at the position calculated using the normalized correlation, as an added area 133 in the reference point 132. Then, as illustrated in FIG. 17, the cutout images 135a, 135b, 135c, . . . are added to create an added image 136.

Similarly, as illustrated in FIGS. 18(a) and 18(b), the image cutout and adding processing are performed for the image 140 of the lower-layer pattern. In the present embodiment, the SN ratio of the lower-layer pattern is low and, thus, the lower-layer pattern is not viewed clearly in the image 140 for lower-layer pattern; however, the image 130 for upper-layer pattern is used to identify the cutout position in the image for lower-layer pattern, thus causing no problem. Specifically, a reference point 142 in the image 140 is set so as to have the same coordinates as those of the reference point 132 of the image 130. Further, points 143a and 143b have the same coordinates as those of the points 134a and 134b, respectively. Accordingly, images 145a, 145b, and 145c to be cut out from the image 140 are cut out from the same positions as those of the images cut out from the image 130. The above images 145a, 145b, 145c . . . are added to create an added image 146. In the obtained added image 146, the SN ratio is improved and, thus, the lower-layer pattern can visually be confirmed.

Figure 19A:
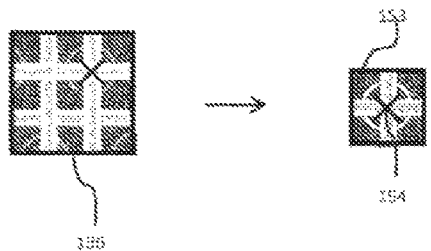
FIGS. 19A and 19B are explanatory views of a misalignment amount calculation method in the superposition measurement of the second embodiment.
Figure 19B:
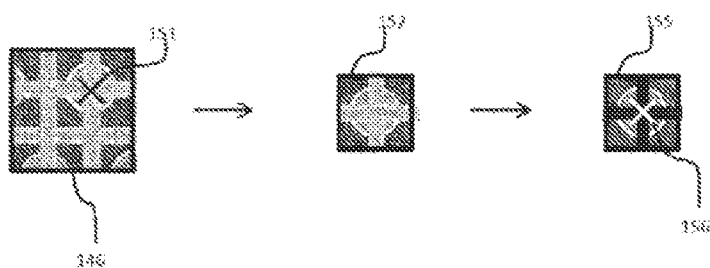

After creation of the added images from the upper-layer and lower-layer pattern images, the superposition misalignment amount is calculated according to a procedure illustrated in FIGS. 19(a) and 19(b). First, a position 151 in the added image 146 for lower-layer pattern that coincides with the template 70 is calculated using the normalized correlation, and an image 152 having the same portion as that of the template 70 is cut out. Further, an image is cut out from the added image 136 for upper-layer pattern at a position corresponding to the cut out image 152 to create an image 153 having the same portion as that of the template 69. Then, in the image 153, a center position 154 of the cross pattern in the upper layer is calculated. After that, an image 155 in which a position in the image 152 having a brightness equal to or larger than a threshold value has been masked out is created, and a center position 156 of the lower-layer pattern is calculated.

The superposition misalignment amount is calculated, according to the following expressions, from the pixel-based center position 154 (Mx, My) of the upper-layer pattern, pixel-based center position 156 (Nx, Ny) of the lower-layer pattern, and the pixel size S.

misalignment amount in $X$-direction: $(Mx-Nx) \cdot S$ misalignment amount in $Y$-direction: $(My-Ny) \cdot S$ After completion of measurement at all the measurement points, the measurement result file 120 illustrated in FIG. 14 is output.

Figure 20:
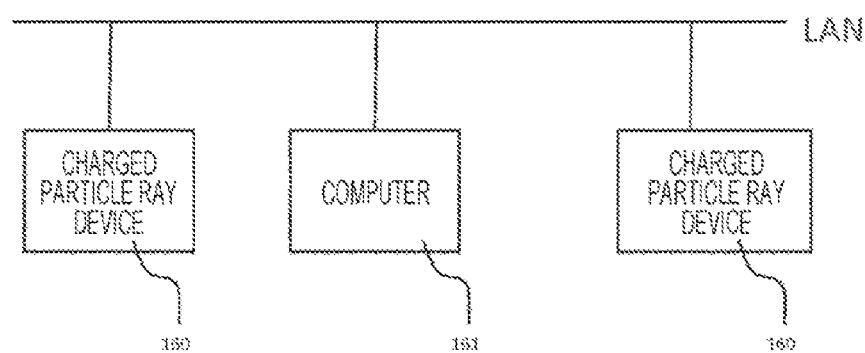
FIG. 20 is an explanatory view of a system configuration using the superposition measuring apparatus of the first and second embodiments.

The present invention is not limited to the above-described embodiments, but may include various modifications. For example, as illustrated in FIG. 20, it is possible to make a computer 161 connected to a plurality of charged particle ray devices 160 over a network execute the above-described processing. The charged particle ray devices 160 perform the image acquisition processing, and the computer 161 performs other processing than the image acquisition, whereby it is possible to construct an effective superposition measurement system.

The above-described embodiments have been described in detail for easy understanding of the present invention and, thus, the invention should not be necessarily limited to embodiments each having all of the described configurations. Further, a part of the configuration of one of the embodiments can be replaced with that of another embodiment. Moreover, the configuration of one of the embodiments further includes constituent elements of another embodiment. Further, a part of the configuration of each embodiment can be subjected to addition, deletion and replacement of another configuration. Further, the above-described respective functions, processors, and processing units are designed by, for example, an integrated circuit, so as to be realized by hardware. Alternatively, the above respective configurations and functions may be realized by software with the interpretation and execution of a program that realizes the respective functions.

Information such as a program, a table, and a file for realizing the respective functions can be stored in not only a memory, but also in a recording device such as a hard disc or an Solid State Drive (SSD), or in a recording medium such as an IC card, an SD card, or an optical disk.

In addition, only control lines or information lines necessary for explanation are illustrated and the control lines or information lines do not mean all control lines or information lines necessary for a product. In actuality, almost all configurations may be connected to each other.

REFERENCE SIGNS LIST 1 column
2 sample chamber
3 electron gun
4 condenser lens
5 aligner
6 E×B filter
7 deflector
8 objective lens
9 secondary electron detector
10 reflected electron detector
11 wafer
12 standard sample
13 XY stage
14 optical microscope
15, 16 amplifier
17 beam scan controller
18 stage controller
19 image processing board
20 control PC
21 lower layer
22 upper layer
23 silicon oxide
24 silicon pattern
25 rectangular hole
26a, 26b, 26c, 26d rectangular hole
51 GUI
52 map display area
53 image display area
54 wafer map select button
55 shot map select button
57 optical microscope image select button
58 SEM image select button
59 display magnification change button 60a image condition setting button
60b image acquisition button
61a template registration tab
61b measurement point registration tab
62a reference point
62b, 62c, 62d, 62e point
63 pitch calculation button
64 pitch display section
65 sub pitch number registration section
66 sub pattern registration section
67 template size registration area
68 template acquisition button
69, 70 template
71, 73 offset adjustment button
72, 74 gain adjustment button
75 template determination button
76 GUI control unit
76a information input/output section
76b image display section
77 image storage unit
77a acquired image storage section
77b template intermediate image storage section
77c brightness-converted image storage section
77d added image storage section
78 information storage unit
78a parameter storage section
78b template image storage section
79 image processing unit
79a pattern matching processing section
79b adding processing section
79c brightness conversion section
79d misalignment calculation section
81a, 81b, 81c, 81d measurement point
82 in-shot coordinates display area
83 measurement shot display area
84 wafer origin
85a, 85b measurement shot
90, 100, 130 image
91a to 91h position
92, 121 image condition setting window
93, 122 acceleration voltage setting area
94, 123 probe current setting area
95, 124 X-direction image size setting area
96, 125 Y-direction image size setting area
97, 126 image adding frequency setting area
101, 111 reference point
102a, 102b, 102c, 112a, 112b, 112c cutout image
103, 113 added image
104, 114 center position
120 measurement result file
127 detector setting area
128 added image extension size setting area
131 search area
132, 142 reference point
133, 143 added area
134a, 134b, 144a, 144b maximum correlation point
135a, 135b, 135c, 145a, 145b, 145c cutout image
136, 146 added image
151 maximum correlation position
152, 153, 155 image
154 center position
156 center position
160 charged particle ray device
161 computer

The invention claimed is:

1. A superposition measuring apparatus that measures a difference between a position of an upper-layer pattern of a sample and a position of a lower-layer pattern thereof by using an image obtained by irradiation of a charged particle ray, the superposition measuring apparatus comprising:
a pattern matching processing section that identifies a plurality of first portions each having a predetermined pattern from among images each in which contrast is optimized for the upper-layer pattern and identifies a plurality of second portions each having a predetermined pattern from among images each in which contrast is optimized for the lower-layer pattern;
adding processing section that cuts out the first portions and second portions as first partial images and second partial images, respectively, and adds the plurality of first partial images and plurality of second partial images to generate a first added image and a second added image; and
a misalignment calculation section that calculates a difference between the position of the upper-layer pattern identified by using the first added image and position of the lower-layer pattern identified by using the second added image.

2. The superposition measuring apparatus according to claim 1, wherein the misalignment calculation section identifies the position of the lower-layer pattern from an image obtained by removing, using information of the position of the upper-layer pattern identified by using the first added image, the upper-layer pattern from the second added image.

3. The superposition measuring apparatus according to claim 1, comprising a brightness conversion section that applies two different gray-level conversions to one image of the sample to generate the image in which contrast is optimized for the upper-layer pattern and image in which contrast is optimized for the lower-layer pattern.

4. The superposition measuring apparatus according to claim 1, comprising a plurality of detectors that detect signal electrons from the sample, wherein an image formed by a signal obtained from the first detector is used as the image in which contrast is optimized for the upper layer, and an image formed by a signal obtained from the second detector is used as the image in which contrast is optimized for the lower layer.

5. The superposition measuring apparatus according to claim 1, comprising a storage section that stores a first template image optimized for the upper-layer pattern and a second template image optimized for the lower-layer pattern, wherein a size of a field of view of each of the first and second partial images is larger than a size of a field of view of the first template image.

6. The superposition measuring apparatus according to claim 5, wherein the size of the field of view of each of the first and second partial images is larger than that of the first template image by the maximum distance among a calculated distances from each of virtual reference points arbitrarily set on the sample to a position closest to a position at which the upper and lower layers have the same pattern as that of the second template image.

7. The superposition measuring apparatus according to claim 5, wherein the size of the field of view of each of the first and second partial images includes a range equal to or larger than at least a period in which the same pattern is repeated in both the upper and lower layers.

8. The superposition measuring apparatus according to claim 1, comprising a storage section that stores a first template image optimized for the upper-layer pattern, wherein the pattern matching processing section identifies the first portion by using the first template image.

9. The superposition measuring apparatus according to claim 8, wherein the pattern matching processing section uses the first template image to identify the first portion from the image in which contrast is optimized for the upper-layer pattern and identifies, as the second portion, a position in the image in which the contrast is optimized for the lower-layer pattern that corresponds to the first portion.

10. The superposition measuring apparatus according to claim 9, wherein the storage section further stores a second template image optimized for the lower-layer pattern, and the pattern matching processing section calculates a position of the same pattern as that of the second template image from the image in which contrast is optimized for the lower-layer pattern, calculates a position of the same pattern as that of the first template image from the image in which contrast is optimized for the upper-layer pattern using the position of the same pattern as that of the second template image as a reference, and uses the calculated position of the same pattern as that of the first template image as a reference for identifying the first portion.

11. A superposition measuring method that measures a difference between a position of an upper-layer pattern and a position of a lower-layer pattern by using an image obtained by irradiation of a charged particle ray, the superposition measuring method comprising:

cutting out a plurality of first partial images each having a predetermined pattern from among images each in which contrast is optimized for the upper-layer pattern;

cutting out a plurality of second partial images each having a predetermined pattern from among images each in which contrast is optimized for the lower-layer pattern;

adding the plurality of first partial images to generate a first added image;

adding the plurality of second partial images to generate a second added image; and calculating a difference between a position of the upper-layer pattern identified using the first added image and a position of the lower-layer pattern identified using the second added image.

12. A superposition measurement system in which a charged particle ray device that acquires an image by irradiation of a charged particle ray and a computer that measures a difference between a position of an upper-layer pattern of a sample and a position of a lower-layer pattern thereof by using the obtained image are connected over a network, the superposition measurement system comprising:

a pattern matching processing section that identifies a plurality of first portions each having a predetermined pattern from among images each in which contrast is optimized for the upper-layer pattern and identifies a plurality of second portions each having a predetermined pattern from among images each in which contrast is optimized for the lower-layer pattern;

adding processing section that cuts out the first portions and second portions as first partial images and second partial images, respectively, and adds the plurality of first partial images and plurality of second partial images to generate a first added image and a second added image; and a misalignment calculation section that calculates a difference between the position of the upper-layer pattern identified by using the first added image and position of the lower-layer pattern identified by using the second added image.

\* \* \* \* \*